(12) United States Patent
Lidman

(10) Patent No.: US 7,088,868 B1
(45) Date of Patent: Aug. 8, 2006

(54) COMPRESSION AND DECOMPRESSION CODING SCHEME AND APPARATUS

(75) Inventor: Johan Lidman, Stockholm (SE)

(73) Assignee: St. Jude Medical AB, Jarfalla (SE)

( * ) Notice: Subject to any disclaimer, the term of this patent is extended or adjusted under 35 U.S.C. 154(b) by 679 days.

(21) Appl. No.: 10/070,701

(22) PCT Filed: Sep. 7, 2000

(86) PCT No.: PCT/SE00/01744

§ 371 (c)(1),
(2), (4) Date: Jul. 2, 2002

(87) PCT Pub. No.: WO01/18973

PCT Pub. Date: Mar. 15, 2001

(30) Foreign Application Priority Data

Sep. 8, 1999 (SE) .................................... 9903191

(51) Int. Cl.
*G06K 9/46* (2006.01)

(52) U.S. Cl. ...................... 382/243; 382/238; 382/246

(58) Field of Classification Search ......... 382/232–247
See application file for complete search history.

(56) References Cited

U.S. PATENT DOCUMENTS

| | | | |
|---|---|---|---|
| 5,448,642 A | 9/1995 | Yeh | 382/232 |
| 5,852,469 A | 12/1998 | Nagai et al. | 375/240.23 |
| 6,188,793 B1 * | 2/2001 | Kimura et al. | 382/238 |

FOREIGN PATENT DOCUMENTS

EP    0 716 529    6/1996

OTHER PUBLICATIONS

"An ECG Compression Scheme Based on Vector Quantisation," GholamHosseimi, Proceedings of the 1st Joint BMES/EMBS Conference Serving Humanity, Advancing Technology, Oct. 13-16, 1999, p. 1025.
"Compression of Multichannel ECG Through Multichannel Long-Term Predication," Cohen et al., IEEE Engineering in Medicine and Biology, Jan.-Feb. 1998, pp. 109-115.

* cited by examiner

*Primary Examiner*—Duy M. Dang
(74) *Attorney, Agent, or Firm*—Schiff Hardin LLP

(57) ABSTRACT

In a compression and decompression coding method, arrangement and computer program product, a data signal containing a number of symbols is converted into a series of codewords. A set of codewords is established and the data signal is monitored to determine the most frequently occurring symbols therein and/or sequences of symbols therein containing at least two symbols. A codeword is then allocated to each of the most frequently occurring of the symbols and/or symbol sequences. At least one codeword is reserved for indicating uncompressed data. When compressing a signal, the incoming symbols are first checked to determine if they correspond to a codeword. If a symbol corresponds to more than one codeword, further symbols are read until a symbol occurs which corresponds to one codeword only. That codeword is then transmitted. Any symbol that does not correspond to a codeword is supplemented with a codeword indicative of no compression and is then transmitted.

18 Claims, 6 Drawing Sheets

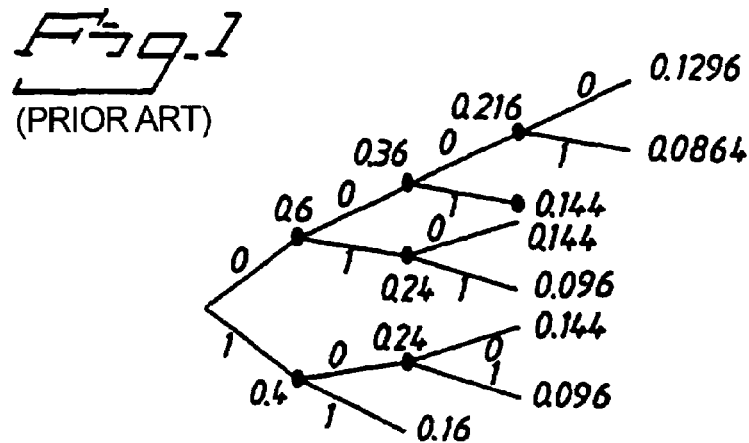
| Symbol sequences | Codeword | Codeword binary form |
|---|---|---|
| 0000 | 1 | 001 |
| 0001 | 2 | 010 |
| 001 | 3 | 011 |
| 010 | 4 | 100 |
| 011 | 5 | 101 |
| 100 | 6 | 110 |
| 101 | 7 | 111 |
| 11 | 8 | 000 |
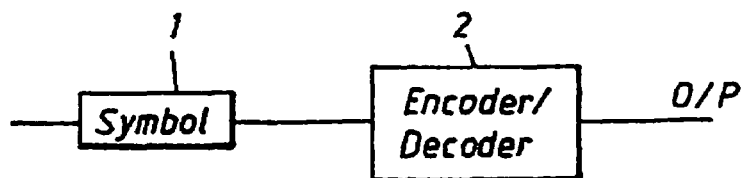

Fig. 5
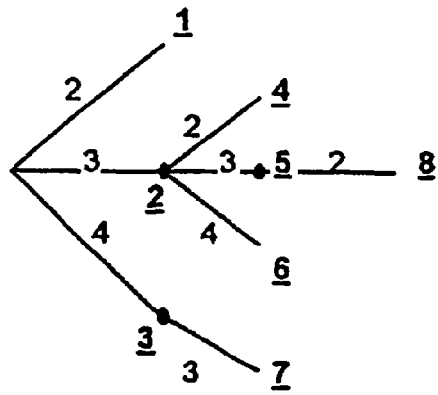
Fig. 6
| Symbol sequence | Codeword |
|---|---|
| 2 | 1 |
| 3 | 2 |
| 4 | 3 |
| 32 | 4 |
| 33 | 5 |
| 34 | 6 |
| 43 | 7 |
| 332 | 8 |
Fig. 7
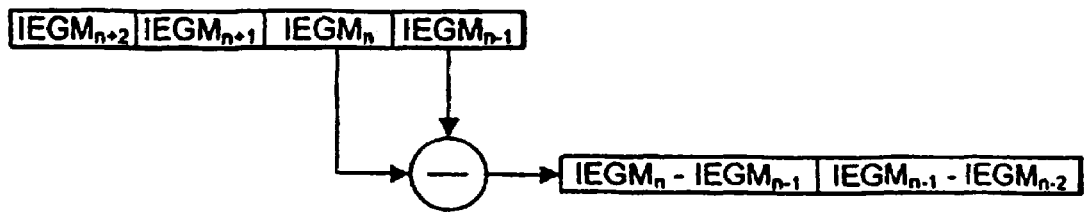

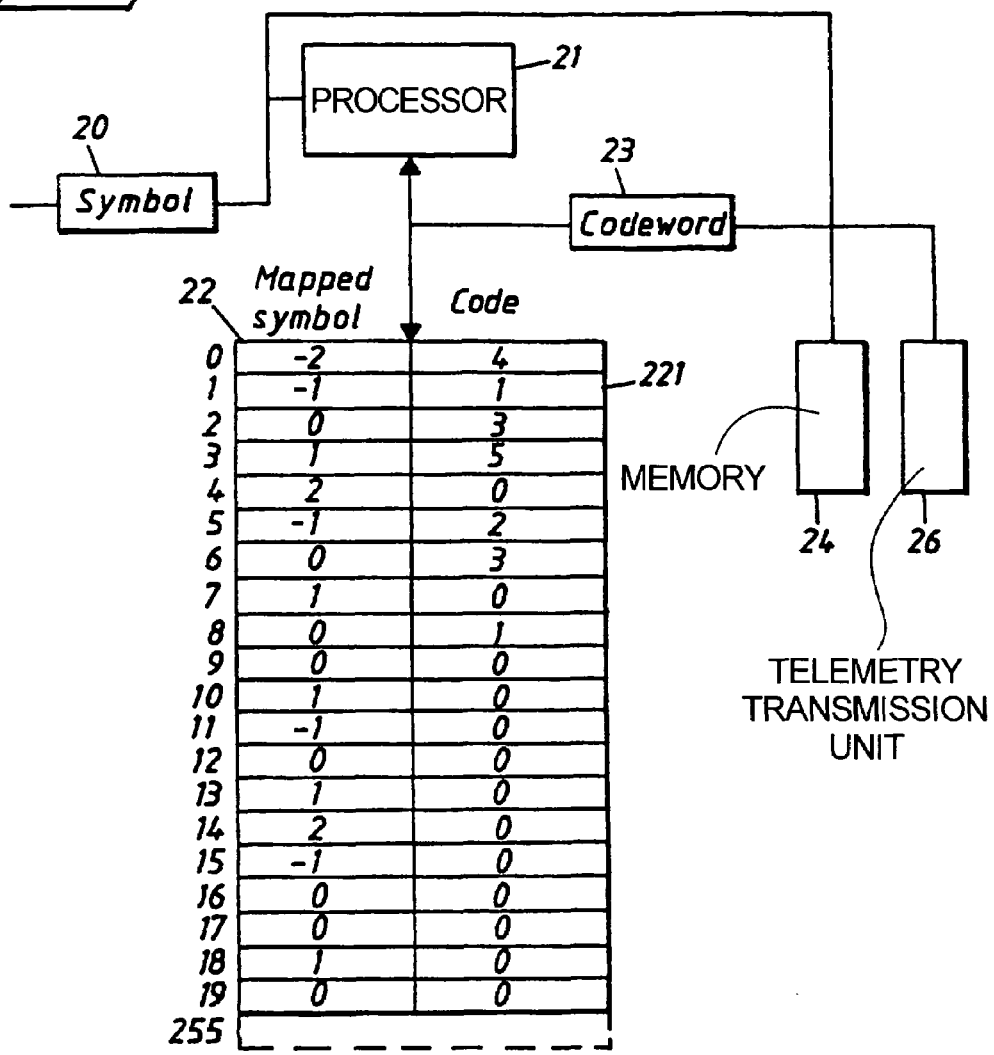

Fig. 11a
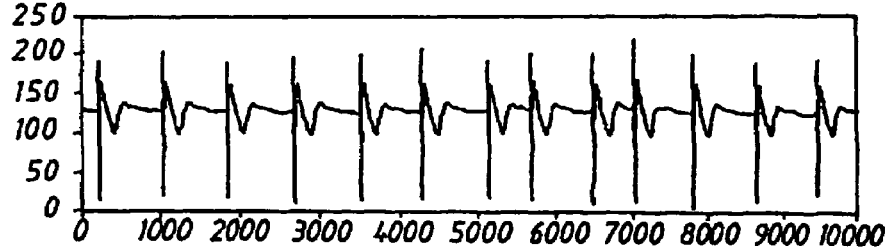
Fig. 11b
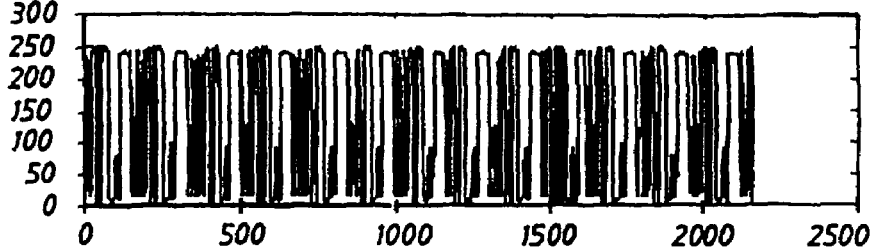
Fig. 11c
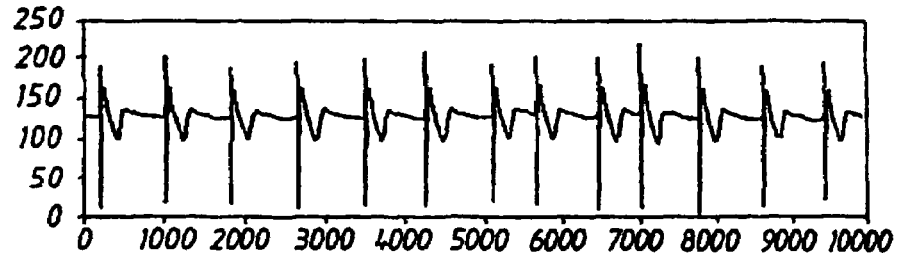
Fig. 11d
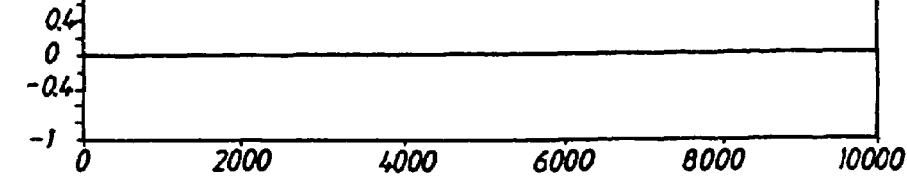
Fig. 11e1

COMPRESSION AND DECOMPRESSION CODING SCHEME AND APPARATUS

BACKGROUND OF THE INVENTION

1. Field of the Invention

The present invention relates generally to a coding scheme and apparatus for the compression and decompression of data. It is particularly directed to the compression of signals that exhibit so-called memory, where a portion of a signal depends on the value of a preceding portion. The invention has particular application to medical systems, such as implantable pacemaker devices, which have limited memory but require the storage of large quantities of data.

2. Description of the Prior Art

Medical systems for monitoring physiological functions are becoming more complex as the need for diagnostic applications increases. In particular there is a need for intracardial detection systems and pacemaker systems capable of storing ever increasing numbers of signals, such as electrocardiogram signals (EGG and IEGM), pressure signals and bioimpedence signals or the like, of ever increasing length. However, the available memory space for data storage is often restricted, particularly in implanted pacemaker systems. Perhaps more importantly in implanted systems, the amount of data that may be collected is also restricted by the transmission capacity of a telemetry link between an implanted device and its programmer or other external control device. For example, a defibrillator today typically requires a transmission time of up to 40 minutes for downloading to its controller all the data that can be collected. If the required quantities of data are to be made available for processing, this data must be compressed.

Data compression can generally be divided into two forms. A first form is based on viewing a signal as a mathematical function and observing and utilizing characteristics of this function to compress data. The second form utilizes coding theory and is based on the statistics of multiple discrete signal levels, or symbols, occurring in a signal.

A conventional algorithm working according to this latter principle is the Tunstall code. This code maps variable-length symbol segments of an input signal into fixed-length codewords. Since the codeword length is fixed, the number of codewords n is known in advance. The object is to assign codewords to symbol segments that occur with approximately equal probability. The procedure begins with a set of symbol segments consisting of each of the individual symbols occurring in the input signal, such as m symbols in total. The most probable symbol is then removed from the set and replaced by m new segments, each of which is the removed symbol suffixed by one of the m input symbols. This procedure continues until the number of symbol segments, Manager, in the set is equal to the number of codewords, n. The codewords are then assigned to the symbol segments.

An example of Tunstall encoding is illustrated in FIGS. 1 and 2. FIG. 1 shows a probability tree comprising nodes, and branches emanating from each node. In the illustrated example it is assumed that S codewords are available for compressing data, 1 to 8. The tree in FIG. 1 assumes that a source signal comprises two signals, '0' and '1'. Each symbol is represented by a first branch. The probability a symbol occurring is given at the node terminating the associated branch. Hence a '0' occurs with a probability of 0.6 and a '1' occurs with a probability of 0.4. The branch with the highest probability is expanded further by adding a second series of branches for each possible symbol. The '0' branch is thus bifurcated into a second '0' branch with a total probability of 0.36 and a '1' branch with probability 0.24. The first branch for symbol '1' now has the highest probability and is expanded in turn, resulting in two further branches with probability of 0.24 and 0.16. This process continues until the number of end branches equals the number of codewords, in the present example 8, with the probability of each branch occurring being relatively close. Each end branch represents a sequence of symbols. These sequences are assigned a codeword as shown in FIG. 2.

A problem associated with Tunstall encoding is that signals containing a large number of different symbols, for instance a large number of discrete signal levels, require a very large number of codewords. For example, in a pacemaker system, a typical electrogram or IEGM signal is represented by S bits sampled at 512 Hz. The number of symbols in this signal is thus 256. A Tunstall codebook for this signal would have to contain at least 256 codewords just to cover the different individual symbols. In order to obtain compression of the signal, the branches must be expanded further which adds a further 256 codewords per branch. The Tunstall code is a general-purpose data compression algorithm and is not adapted to special classes of data. In particular it is not effective when applied to signals which exhibit memory. Typically, many of the signals monitored by medical systems, and cardiac pacers in particular, exhibit some memory, one example being the IEGM signal. The use of Tunstall encoding for processing sampled data in medical systems, and specifically implanted systems, is thus limited.

SUMMARY OF THE INVENTION

It is an object of the present invention to provide a coding method and apparatus that allows a signal exhibiting memory to be compressed and decompressed efficiently and without distortion.

The above object is achieved in accordance with the present invention in a data coding method for converting a signal containing a plurality of symbols into codeword, and an apparatus and software product for implementing the method, including the steps of: establishing a set of codewords, monitoring a data signal and determining the most frequently occurring symbols and/or sequences of symbols containing at least two symbols, allocating one codeword to each of the most frequently occurring of said symbols and/or symbol sequences.

According to a further aspect, the invention provides a data compression method for compressing a data signal containing a plurality of symbols, including: converting the most frequently occurring symbols and/or symbol sequences into codewords, supplementing the remaining symbols with at least one codeword indicative of no compression.

The invention further proposes an arrangement for compressing and decompressing a data signal containing a plurality of symbols, including: means for storing codewords corresponding to symbols and/or symbol sequences, and means for determining if a symbol in said data signal corresponds to at least one codeword in the storage means and, when a symbol corresponds to only one codeword, for transmitting said codeword, wherein the determining means are further adapted to transmit a symbol if it corresponds to no codeword in the storage means.

According to a fourth aspect, the invention proposes a computer program product for converting a signal containing a plurality of symbols into a compressed signal, including computer readable program code means for establishing a set of codewords, determining the most frequently occurring symbols and/or sequences of symbols containing at least two symbols in a data signal and allocating one codeword to each of the most frequently occurring of said symbols and/or symbol sequences.

By providing codewords to only the most frequently occurring symbols and symbols sequences, the number of codewords required is greatly reduced. At the same time however the efficiency of the compression is increased, as these codewords are allocated to the varying length symbol sequences that appear with the highest frequency in the signal. This compression technique furthermore fully exploits any memory in a signal. A further difference over prior art coding schemes and the Tunstall code in particular is that codewords may be allocated to every node and end branch in a coding tree and not just the end branches. This is also particularly useful when compressing signals that exhibit memory such as signals monitoring physiological quantities such as the heartbeat, respiration rate and the like.

DESCRIPTION OF THE DRAWINGS

FIG. 1, as noted above, depicts a coding tree illustrating the Tunstall encoding algorithm.

FIG. 2, as noted above, depicts a coding table corresponding to the coding tree of FIG. 1.

FIG. 3 is a schematic block diagram of an encoder/decoder (compressor/decompressor) according to the present invention.

FIG. 5 depicts a coding tree corresponding to the histograms of FIGS. 4a through 4e.

FIG. 6 depicts a codebook corresponding to the coding tree of FIG. 5.

FIG. 7 is a schematic illustration of a pre-processing function in accordance with the present invention.

FIG. 8 is a schematic diagram of an arrangement for compressing and decompressing data according to the present invention.

FIG. 9 is a schematic illustration of a codebook memory illustrating the mapping between symbols and memory locations in accordance with the invention.

FIGS. 11a through 11e are a sequence of graphs illustrating the compression and subsequent decompression of an IEGM signal, in accordance with the present invention.

DESCRIPTION OF THE PREFERRED EMBODIMENTS

Figure 4A:
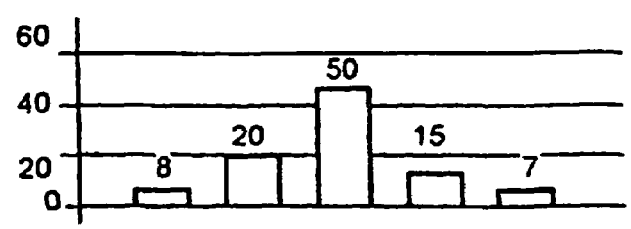
FIGS. 4a through 4e are a series of histograms illustrating the generation of a codebook according to the present invention.

The compressing and decompression scheme according to the present invention is based on the representation of a data signal containing a plurality of symbols into coded form utilizing codewords of fixed length. The symbols contained in an input signal may be digital representations of characters, such the ASCII format. Typically, however, the symbols will be binary representations of discrete signal levels in a sampled analogue signal, such as an ECG, IEGM or other signals for monitoring physiological activity.

FIG. 3 schematically illustrates the function of an encoder/decoder for compressing and decompressing a data signal. The data signal contains a plurality of symbols which are read by a symbol reader I and relayed to an encoder/decoder 2. The encoder/decoder 2 has access to a storage medium 3 containing a codebook of the fixed-length code-words. The input symbols or symbol sequences are mapped to codewords in the codebook 3 and replaced by the corresponding codeword. The reduction of symbols and symbol sequences of variable length into codewords results in the compression of the data. Decompression is accomplished by inverting the operation. Codewords are passed through the encoder/decoder 2, which with the aid of the mapping to the codebook 3 reconstitutes the original input sequence.

The generation of a codebook according to the present invention commences with determining the number of codewords to be used. This is selected as a function of the total number of symbols contained in an input signal and the degree of compression required.

The codebook is generated by observing the input signal during a test phase and determining the probabilities of the symbols and sequences of symbols occurring. This is accomplished by observing the input signal during a set time period, for example 20 s, and noting the symbol that occurs with the highest frequency during this period. The signal is then observed again for the same time period and the symbol that follows the noted symbol most frequently is noted. This process continues until the number of most frequently occurring symbols and/or symbol sequences noted is equal to the number of codewords in the codebook. It will be understood, that only those symbols or symbol sequences that occur most frequently will be coded. This allows the number of codewords to be kept to a reasonable number.

A simplified example of this process is illustrated in FIGS. 4a–4e, 5 and 6 with reference to the generation of a codebook containing 8 symbols. The input signal consists of 5 symbols 1, 2, 3, 4, 5.

Figure 4B:
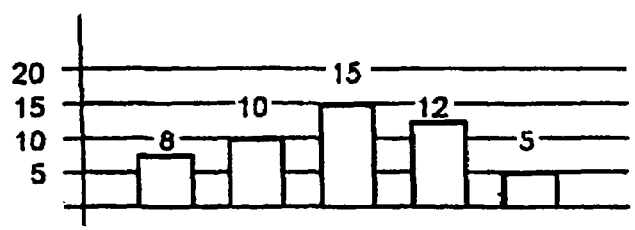
Figure 4C:
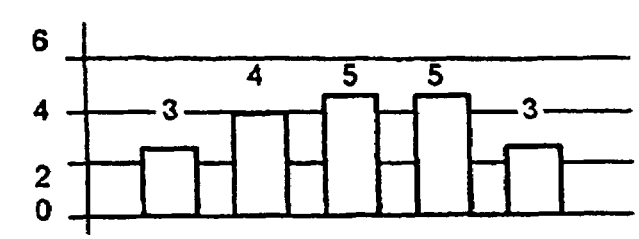
Figure 4D:
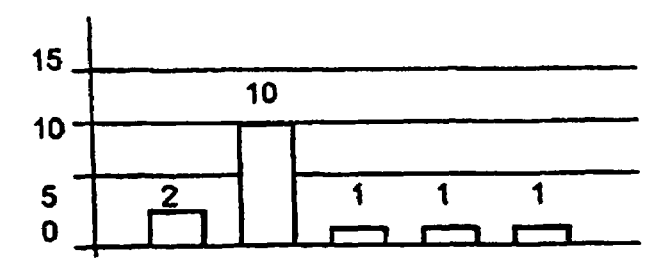
Figure 4E:
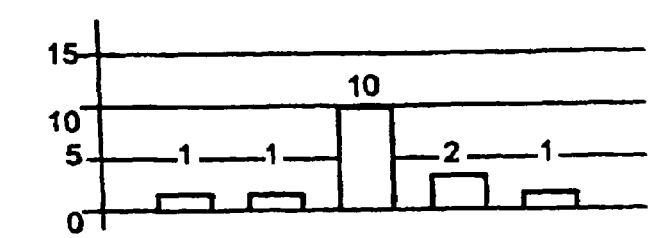

Turning now to FIG. 4a, a first histogram is produced after observing the input signal for a set period. It is evident that the most frequently occurring symbol is 3 with an occurrence of 50. FIG. 4b shows a histogram produced after the same period of time and gives the frequency of the different symbols that follow 3. Thus the sequence 32 has occurred ten times, the sequence 33 fifteen times, and the sequence 34 twelve times. FIG. 4c shows a histogram of the symbols following 2 and FIG. 4d shows a histogram of the symbols following the symbol sequence 3, 3. Finally FIG. 4e shows the histogram of the symbols following the symbol 4. The codebook is established by determining which of the 8 symbols and/or symbol sequences occurred most frequently. This is illustrated schematically in a code tree in FIG. 5. In this code tree, a codeword has been assigned to every node and end branch. Hence the symbol 3 has been allocated the codeword '2' but the symbol sequence 33 has also been allocated a codeword, '5' and the symbol sequence 332 has been allocated the codeword '8'. This is summarized in tabular form in FIG. 6.

It is apparent from the above example that codewords are not assigned to every symbol of an input signal. Thus when these unassigned symbols are read by an encoder, the symbol is transmitted uncompressed. To distinguish the uncompressed data from the compressed data, it is preferable to utilize some form of distinguishing symbol or codeword. Thus at least one codeword will be reserved for transmitting uncoded input symbols.

Depending on the signal to be compressed, it may be desirable to pre-process the signal in order to increase the frequency of a very few symbols and sequences. This considerably increases the efficiency of the compression. For example, pre-processing can be very effective when compressing sampled IEGM, EGG or other physiological signals that monitor some form of periodic activity.

FIG. 7 schematically illustrates the preferred function of such a pre-processor. In FIG. 7 an input data stream denoted by 10 comprises the symbols IEGMn−1, IEGMn, IEGMn+1 and IEGMn+2. The function generates the difference symbol value between a symbol and a preceding symbol. The output data stream 12 thus comprises the symbols (IEGMn−IEGMn−1) and (IEGMn−1−IEGMn−2), etc.

In a preferred embodiment of the present invention, the compression coding scheme according to the invention is used to compress an IEGM signal comprising 255 symbols ranging from 0 to 254. After pre-processing in accordance with the function of FIG. 7, the signal contains 509 possible symbols, ranging from −254 to +254. However, while the number of possible symbols has almost doubled, the form of the original IEGM signal is such that the processed signal contains mainly symbols close to 0 such as 1, −1, 2, −2 etc. Thus the concentration of a very few symbols and symbol sequences is increased by the difference function.

A codebook generated for a pre-processed IEGM signal of the type described above can typically be efficiently compressed utilizing a codebook containing 254 codewords, for example 254 8-bit words ranging from 0 to 253. The 254 most frequently occurring symbols and/or symbol sequences are then converted into codewords. The 8-bit words with values 254 and 255 are then reserved. These are utilized to signal whether data is compressed or uncompressed. Preferably, one reserved codeword, for example 255, is sent to indicate that uncompressed data follows. The other codeword 254 can then be utilized to signal that compressed data is following. To avoid having to generate different symbols for negative and positive symbols, an uncompressed negative symbol is preferably indicated by preceding it with both symbols sent contiguously, for example, 255 followed by 254 followed by the uncompressed equivalent positive symbol.

The codebook is preferably generated for a class of signals and retained for different signals of the same class so that it does not need to be re-established prior to compressing data. For example, a cardiac pacer containing data compression and decompression circuitry for processing some physiological measurement such as an IEGM signal, EGG signal or bioimpedance signal could be subjected to a training phase for each patient to establish a codebook that is specific to each patient. The training phase could also be performed using a test sequence that is representative of the class of signal, so that one codebook is used for several patients. A further option would be to utilize an adaptive procedure, whereby the statistics of the signal are observed and a codebook newly generated prior to each compression. This codebook would then be optimized for each signal generated in a pacemaker. However, it will be understood that the codebook must be retained long enough to enable the compressed data to be decompressed.

In the coding procedures described above, a codeword is allocated to every node and end branch of a probability tree. It will, however, be understood that codewords could be assigned only to the end branches of the tree. The efficiency of such a code would depend on the characteristics of the starting signal.

An arrangement for encoding and decoding a signal is illustrated in FIG. 8. The arrangement includes an input stage 20 for reading a symbol. A processor 21, that preferably takes the form of a single chip microprocessor with associated memory, is coupled to the input stage. A codebook memory 22 having 256 8-bit memory locations with addresses from 0 to 255 is connected to the processor 21. An output stage 23 for the codewords is coupled to the memory 22 and processor 21. This output stage 23 is finally coupled to a storage memory 24 for storing the compressed data and to a telemetry transmission unit 26, which forwards the data to a remote external programmer or controller. The input stage 20 is also coupled to the storage memory 24 and telemetry transmission unit 26 for transmitting uncompressed data. The encoding and decoding arrangement is preferably preceded by a preprocessing stage as shown in FIG. 7.

The function of this arrangement is basically as follows. A first symbol is read by the input stage 20. The processor 21 checks whether this symbol corresponds to more than one symbol sequence in the codeword memory 22 and if so, the next symbol is read. This process is repeated until the sequence of symbols read corresponds to only one codeword. This codeword is then emitted in place of the symbol sequence and is either stored in the memory 24 or sent directly to an external device via the telemetry transmission unit 26. If a symbol read corresponds to no coded sequences it is transmitted unchanged to the storage memory 24 or transmission unit 26 but preceded by the codeword 254 indicating uncompressed data.

The addresses 0 to 255 of the codebook memory 22 are the codewords. The processor 21 furthermore performs a mapping between the incoming symbols that form at least part of a coded sequence and each memory cell 221. This is illustrated in more detail in FIG. 9. The first symbol in a sequence will cause the processor 21 to access the first memory cell, in ascending order of address, to which the symbol is mapped. These first memory cells 221 correspond to the first branches in a probability tree. Thus if the first symbol in a sequence is '1', the processor 21 will access the fourth memory location (address 3), since this is the first location 221 to which a '1' is mapped. Each memory cell 221 further contains information indicating whether the mapped symbol corresponds to more than one coded symbol sequence. This information is shown on the right hand side of each memory cell 221. The information is in the form of a code represented by the numbers 0 to 7, which indicate both the number of possible further branches and the following symbols corresponding to the further branches. A conversion table 25 shows the significance of each number. Hence it can be seen that '0' indicates an end branch, '2' represents two possible further branches with the following symbols '1' and '2'. Any symbol mapped to a memory cell 221 containing a '0' will result in the processor 21 transmitting the address of the memory cell as a codeword. Any other number contained in the memory cell 221 indicates that at least one further branch is possible. The processor 21 then fetches the next symbol from the input stage 20 and determines whether this symbol forms part of the possible codewords. If it does, the processor 21 calculates the address of the next memory cell 221 and the process is repeated.

The next address is calculated by summing the number of possible branches contained in all addresses starting from the first address up to the present address, and then adding the position of the fetched symbol in the list of possible symbols given in the conversion table 25. The sum of possible branches is equal to the sum of the first mapped memory locations representing the initial branches of the probability tree and the possible branches stored in all previous memory locations. Thus an input sequence consisting of 1, 2 would result in a first mapping being made to memory location 3. This contains the code 5, which indicates that four further branches are possible. The next symbol is fetched. It is verified that '2' corresponds to one of the possible branches. The symbol '2' has the fourth position in the list of branches (−1, 0, 1, 2) given in the conversion table 25. Thus the sequence 1, 2 is a valid coded sequence. The next address is equal to the sum of the initial basic branches (i.e. the addresses to which a first symbol can be mapped), which in the present example is 5 (addresses 0 to 4). To this is added the sum of the branches contained in memory locations up to address 3, and the position of the subsequent symbol in the list indicated in memory location 3. This gives a total of 5+(3+1+2)+4=15. The next address is thus the 15th location or address 14, since the addresses start with 0. This is verified by the mapping of the symbol 2 indicated in the left column of the cell with address 14.

The conversion table 25 alternatively may be more complex in structure and provide absolute memory locations corresponding to each possible branch. In this way the next address would not need to be calculated, but more storage capacity would be needed.

The conversion table is preferably stored in the processor 21. However, it may be possible to store some of the information about the branches in the codebook memory 22, depending on how much capacity is available for each address.

The arrangement illustrated in FIG. 8 is a schematic representation of possible encoding and decoding hardware. It will however, be understood that the functions of the various elements shown in FIG. 8 may be performed entirely in a digital processor system operating under the control of a program. The codebook memory 22 could then be implemented virtually from part of the memory space incorporated in the processor system.

Figure 10:
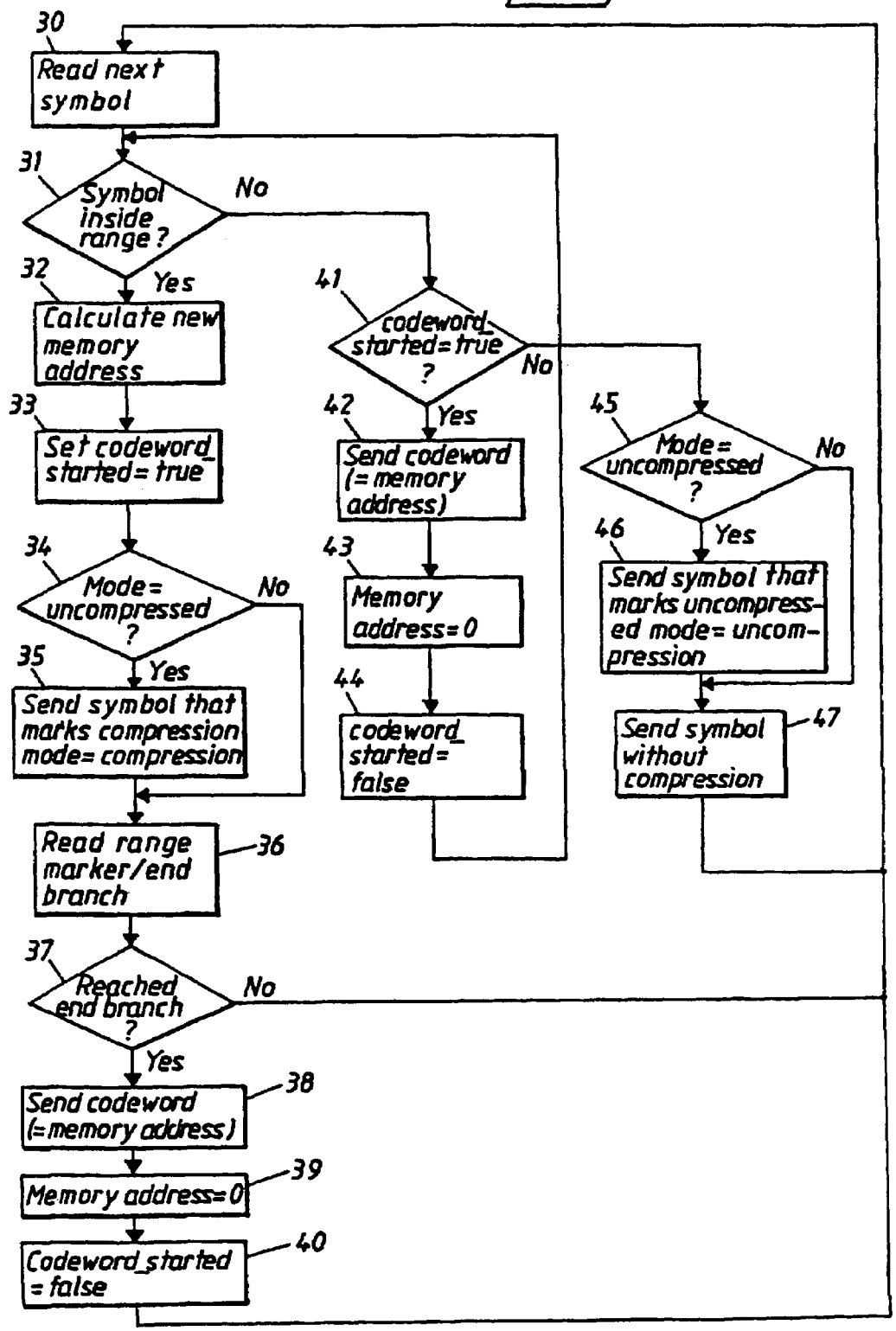
FIG. 10 is a flowchart illustrating a method for compressing data utilizing the inventive arrangement of FIG. 8.

FIG. 10 is a flow chart illustrating the procedure for compressing data using the arrangement shown in FIGS. 8 and 9. The procedure starts at step 30 with the reading of a symbol. In step 31 it is determined whether the symbol is inside the designated range, i.e. whether the symbol forms part of a coded sequence and can be mapped to a memory location. If this is the case, the process moves to step 32 and the new memory address is calculated. In the following step 33 a marker, 'codeword_started', indicating that the coding of a sequence has started, is set. In step 34 it is verified whether the data last sent was uncompressed. If this is true, in step 35 the symbol indicating compression is sent. If the last data sent was in compressed mode, the process moves directly from step 34 to step 36, where the contents of the memory location are read and it is determined whether an end branch has been reached. If the end branch has not been reached the procedure returns to step 30 and the next symbol is fetched. If the end branch is reached, the procedure passes to step 38, where the memory address is sent as the codeword. In step 39, the memory address is reset to 0 and in step 40, the marker 'codeword_started' is reset to false, because the coding of a symbol or symbol sequence is terminated. The process then returns to step 30, and the next symbol fetched. If a symbol is discovered to be out of range in step 31, indicating that the symbol does not form part of a coded sequence, the procedure goes to step 41 where the status of the marker 'codeword_started' is verified. If this is true, this means that a codeword has been started, but the subsequent symbol does not form part of the coded sequence. In step 42, therefore, the memory address is sent as the codeword. The memory address is then reset to 0 in step 43, the marker 'codeword_started' reset to false in step 44 and the procedure returns to step 31, where the fetched symbol is checked against the starting symbols of coded sequences to verify if it forms part of a coded sequence. If in step 41, it is determined that no codeword has been started, i.e. the status of the 'codeword_started' marker is false, this means that the fetched symbol is not contained in any coded sequence. In step 45, the transmission mode is checked. If the last data sent was compressed, the symbol indicating uncompressed data is sent in step 46 followed by the read symbol in step 47. If the last transmission was not in compression mode, the symbol is sent in step 47. The procedure then returns to the start at step 30.

Decompression is the exact reverse of the compression procedure described above. Each codeword is converted into the corresponding symbol or symbol sequence. The symbols are then summed to retrieve the original uncompressed data.

FIGS. 11a to 11e illustrate an example using the coding algorithm described above. The algorithm was first trained, i.e. the codebook generated, using an IEGM signal containing 10000 samples sampled at 512 Hz with 8-bit resolution. The training signal is illustrated in FIG. 11a. The algorithm was then tested on an IEGM signal containing 10000 samples sampled at 512 Hz with 8-bit resolution. This uncompressed test signal is depicted in FIG. 11b. FIG. 11c shows the signal after compression. This signal contains 2149 samples which gives a compression ratio of 4.6. FIG. 11d shows the signal of FIG. 11c after decompression. Finally, FIG. 11e shows the difference signal between the original signal depicted in FIG. 11b and the decompressed signal of FIG. 11d. The signal is entirely free of distortion.

In the coding procedures described above, a codeword is allocated to every node and end branch of a probability tree. It will, however, be understood that codewords could be assigned only to the end branches of the tree.

Although modifications and changes may be suggested by those skilled in the art, it is the intention of the inventor to embody within the patent warranted hereon all changes and modifications as reasonably and properly come within the scope of his contribution to the art.

The invention claimed is:

1. A data coding method comprising the steps of:
   monitoring a data signal containing a plurality of symbols and determining a plurality of most frequently occurring data components in said data signal, selected from the group consisting of most frequently occurring symbols and most frequently occurring sequences of symbols containing at least two symbols;
   allocating respective codewords to said most frequently occurring data components, thereby obtaining a codeword set; and
   forming a compressed signal by substituting the respective codewords for said most frequently occurring data components; and
   said data signal including uncoded symbols that are not among said plurality of most frequently occurring symbols, and reserving at least one codeword in said set as an indicator for said uncoded symbols.

2. A method as claimed in claim 1 wherein the step of monitoring said data signal comprises monitoring said data signal during a predetermined time period.

3. A method as claimed in claim 1 wherein said uncoded symbols include uncoded negative symbols, and comprising supplementing said at least one codeword serving as said indicator for uncoded symbols with at least one further codeword, for said uncoded negative symbols, indicative of a negative value.

4. A method as claimed in claim 1 wherein the step of allocating codewords comprises allocating codewords to respective data components that are incorporated in other data components having another codeword allocated thereto.

5. A data compression method comprising the steps of:
converting a plurality of most frequently occurring data components in a data signal containing a plurality of symbols into respective codewords, said most frequently occurring data components being selected from the group consisting of most frequently occurring symbols and most frequently occurring sequences of symbols containing at least two symbols; and
designating remaining symbols in said data signal, not among said most frequently occurring data components, with at least one codeword indicative of no compression; and
substituting said codewords in place of said symbols.

6. A method as claimed in claim 5 comprising setting a predetermined number and a predetermined length for said codewords.

7. A method as claimed in claim 5 comprising preprocessing an input signal containing a plurality of symbols to generate said data signal by generating an additional symbol representing a difference between contiguous symbols in said input signal.

8. A method as claimed in claim 5 comprising the additional steps of:
reading a symbol in said data signal;
determining if the symbol that has been read corresponds to a codeword; and
substituting said codeword for said symbol that has been read if said symbol that has been read corresponds to only one codeword.

9. A method as claimed in claim 8 wherein said symbol that has been read is a first symbol, and comprising the additional steps, if said first symbol corresponds to more than one codeword, of:
reading a subsequent symbol following said first symbol;
determining if said first symbol and said subsequent symbol correspond to a codeword; and
substituting a codeword in place of said first symbol and said subsequent symbol if said first symbol and said subsequent symbol correspond to only one codeword.

10. A method as claimed in claim 9 comprising the additional step, if said symbol that has been read corresponds to no codeword, retaining said symbol that has been read in said data signal.

11. An arrangement for compressing and decompressing a data signal, comprising:
a memory for storing codewords respectively corresponding to data components selected from the group consisting of symbols and symbol sequences; and
a determination unit supplied with a data signal containing a plurality of symbols for determining if a symbol in said data signal corresponds to a codeword in said memory and, if a symbol corresponds to only one codeword in said memory, transmitting that codeword in place of said symbol and transmitting said symbol if said symbol corresponds to no codeword in said memory; and
designating remaining symbols in said data signal, not among said most frequently-occurring data components, with at least one codeword indicative of no compression.

12. An arrangement as claimed in claim 11 wherein said memory includes a plurality of memory locations respectively designating codewords, and wherein each memory location contains an indication of a number of possible symbol sequences, and is mapped to a symbol of said data signal.

13. An arrangement as claimed in claim 12 further comprising a difference symbol generator, connected preceding said determination unit, which generates a difference symbol between contiguous symbols in said data signal.

14. An arrangement as claimed in claim 11 wherein said memory comprises a plurality of memory locations having respective addresses, and wherein said addresses are said codewords.

15. A computer-readable medium encoded with a computer program product for converting a data signal containing a plurality of symbols into a compressed signal, said computer program, when said medium is loaded in a computer, causing the computer to:
establish a set of codewords by determining a plurality of most frequently occurring data components in a data signal, said most frequently occurring data components being selected from the group consisting of most frequently occurring symbols and most frequently occurring sequences of symbols containing at least two symbols;
to allocate one codeword to each of said most frequently occurring data components; and
to designate remaining symbols in said data signal, not among said most frequently occurring data components, with at least one codeword indicative of no compression.

16. A computer-readable medium as claimed in claim 15 wherein said program code causes said computer to compress said data signal by converting said most frequently occurring data components into respective codewords by reading a symbol in said data signal and determining if said symbol corresponds to a codeword, and if so, emitting said codeword instead of said symbol and, if not, emitting said symbol.

17. A data coding method comprising the steps of:
monitoring a data signal containing a plurality of symbols and determining a plurality of most frequently occurring data components in said data signal, said data components consisting of most frequently occurring sequences of symbols containing at least two symbols;
allocating respective codewords to said most frequently occurring data components, thereby obtaining a codeword set; and
forming a compressed signal by substituting the respective codewords for said most frequently occurring data components.

18. A computer-readable medium encoded with a computer program for converting a data signal containing a plurality of symbols into a compressed signal, said computer program, when said medium is loaded in a computer, causing the computer to:
establish a set of codewords by determining a plurality of most frequently occurring data components in a data signal, said most frequently occurring data components consisting of most frequently occurring sequences of symbols containing at least two symbols; and
to allocate one codeword to each of said most frequently occurring data components.

* * * * *